United States Patent
Daley et al.

(10) Patent No.: US 9,516,423 B2
(45) Date of Patent: Dec. 6, 2016

(54) MEMBRANE ARRANGEMENT FOR A MICROELECTROMECHANICAL MEASURING TRANSDUCER AND METHOD FOR PRODUCING A MEMBRANE ARRANGEMENT

(71) Applicant: Robert Bosch GmbH, Stuttgart (DE)

(72) Inventors: Mike Daley, Canonsburg, PA (US);
Rolf Scheben, Stuttgart (DE);
Christoph Schelling, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 74 days.

(21) Appl. No.: 14/391,139

(22) PCT Filed: Mar. 5, 2013

(86) PCT No.: PCT/EP2013/054418
§ 371 (c)(1),
(2) Date: Oct. 7, 2014

(87) PCT Pub. No.: WO2013/152899
PCT Pub. Date: Oct. 17, 2013

(65) Prior Publication Data
US 2015/0078590 A1   Mar. 19, 2015

(30) Foreign Application Priority Data
Apr. 12, 2012   (DE) .................. 10 2012 205 921

(51) Int. Cl.
*H04R 25/00* (2006.01)
*H04R 17/00* (2006.01)
(Continued)

(52) U.S. Cl.
CPC ............. *H04R 17/005* (2013.01); *B81B 3/007* (2013.01); *B81B 3/0086* (2013.01);
(Continued)

(58) Field of Classification Search
CPC .... H04R 1/30; H04R 1/1016; H04R 1/1041; H04R 5/04; H04R 5/033; H04R 19/00; H04R 19/02; H04R 19/016; H04R 27/00; H04R 27/04; H04R 2420/07; B06B 1/0292

USPC ........................ 381/174, 175, 191
See application file for complete search history.

(56) References Cited

U.S. PATENT DOCUMENTS

| | | | |
|---|---|---|---|
| 6,441,451 | B1 | 8/2002 | Ikeda et al. |
| 2006/0233401 | A1 | 10/2006 | Wang |

(Continued)

FOREIGN PATENT DOCUMENTS

| | | | |
|---|---|---|---|
| CN | 102066239 | A | 5/2011 |
| CN | 1838837 | B | 4/2012 |

(Continued)

OTHER PUBLICATIONS

International Search Report corresponding to PCT Application No. PCT/EP2013/054418, mailed Sep. 6, 2013 (German and English language document) (7 pages).

(Continued)

*Primary Examiner* — Brian Ensey
(74) *Attorney, Agent, or Firm* — Maginot, Moore & Beck LLP

(57) ABSTRACT

The disclosure relates to a micro-electromechanical membrane arrangement with a substrate, which has a multiplicity of recesses on a surface, a first electrically conductive electrode layer, which is arranged on the surface of the substrate and has a multiplicity of first depressions coinciding with the recesses, and an electrically conductive membrane layer, which can be deflected in a direction perpendicular to the active surface of the substrate, is arranged over the first electrode layer and is kept at a distance therefrom by a first distance value.

20 Claims, 6 Drawing Sheets

(51) Int. Cl.
  *B81B 3/00* (2006.01)
  *B81C 1/00* (2006.01)
(52) U.S. Cl.
  CPC .. *B81C 1/00158* (2013.01); *B81B 2201/0257* (2013.01); *B81B 2201/0264* (2013.01); *B81B 2203/0127* (2013.01)

(56) References Cited

U.S. PATENT DOCUMENTS

| | | | |
|---|---|---|---|
| 2007/0284682 A1 | 12/2007 | Laming et al. | |
| 2007/0287215 A1 | 12/2007 | Utsumi et al. | |
| 2012/0148071 A1* | 6/2012 | Dehe | H04R 1/005 381/116 |

FOREIGN PATENT DOCUMENTS

| | | |
|---|---|---|
| DE | 102 47 847 A1 | 4/2004 |
| DE | 102 47 487 A1 | 5/2004 |
| DE | 10 2006 055 147 A1 | 5/2008 |
| DE | 10 2007 023 286 A1 | 11/2008 |
| EP | 2 071 871 A1 | 6/2009 |
| JP | 2008-259061 A | 10/2008 |

OTHER PUBLICATIONS

Chen Jing, Dynamic Characteristics of Novel Single-chip Fabricated Corrugated Diaphragms for Micro-acoustic Devices, Solid-state and Integrated-circuit Technology, Oct. 22, 2001, p. 757-760, Piscataway, NJ, USA.

Jing Chen, On the single-shop condenser miniature microphone using Drie and backside etching techniques, Sensors and Actuators A, Jan. 15, 2003, p. 42-47,. Lausanne, CH.

* cited by examiner

MEMBRANE ARRANGEMENT FOR A MICROELECTROMECHANICAL MEASURING TRANSDUCER AND METHOD FOR PRODUCING A MEMBRANE ARRANGEMENT

This application is a 35 U.S.C. §371 National Stage Application of PCT/EP2013/054418, filed on Mar. 5, 2013, which claims the benefit of priority to Serial No. DE 10 2012 205 921.0, filed on Apr. 12, 2012 in Germany, the disclosures of which are incorporated herein by reference in their entirety.

The disclosure relates to a membrane arrangement for a microelectromechanical measuring transducer and to a method for producing a membrane arrangement for a microelectromechanical measuring transducer, in particular for microelectromechanical pressure sensors, microphones and loudspeakers.

BACKGROUND

Miniaturized pressure sensors and acoustic signal transducers such as microphones or loudspeakers are used for various applications, for example for acoustic component parts in portable telecommunications devices.

The sensors and actuators can in this case be produced from microelectromechanical structures (MEMS, "microelectromechanical systems").

Such sensors and signal transducers can be based on the capacitive principle of action, i.e. voltage is applied to two membrane elements arranged with a predetermined geometry with respect to one another. By changing the voltage, movements of the membranes relative to one another can be induced. Alternatively, externally induced membrane movements can result in detectable changes in the capacitance and therefore in the voltage present.

The document DE 102 47 847 A1, for example, discloses a method for producing a membrane for an MEMS component comprising a mating electrode on a substrate. The document DE 10 2006 055 147 B4 discloses a method for producing an acoustic signal transducer structure comprising an oscillatory membrane over a mating electrode on a substrate. The document EP 2 071 871 A1 discloses a membrane for an MEMS component part comprising a corrugated peripheral region for reducing mechanical stresses of the membrane.

There is a need for membrane arrangements, in particular for microelectromechanical acoustic signal transducers, with which the sensitivity of the signal pickup can be improved and the installation space requirement can be correspondingly reduced.

SUMMARY

The present disclosure in accordance with one aspect provides a microelectromechanical membrane arrangement comprising a substrate which has a multiplicity of cutouts in a surface, a first electrically conductive electrode layer, which is arranged on the surface of the substrate and which has a multiplicity of first depressions corresponding to the cutouts, and an electrically conductive membrane layer, which can be deflected in a direction perpendicular to the surface of the substrate, is arranged over the first electrode layer and is spaced apart from said first electrode layer by a first distance value.

The present disclosure in accordance with a further aspect provides a microelectromechanical component comprising a microelectromechanical membrane arrangement according to the disclosure. In a preferred embodiment, the microelectromechanical component can comprise a pressure sensor, a microphone or a loudspeaker.

In accordance with a further aspect, the present disclosure provides a method for producing a microelectromechanical membrane arrangement, in particular for a microelectromechanical component, comprising the steps of introducing cutouts into a surface of a semiconductor substrate, forming a first electrically conductive electrode layer on the surface of the substrate, which electrode layer has a multiplicity of first depressions coinciding with the cutouts, forming an oxide layer on the first electrically conductive electrode layer, depositing an electrically conductive membrane layer on the oxide layer, forming first through-holes in the substrate and the first electrically conductive electrode layer, and etching the oxide layer through the first through-holes in order to free the electrically conductive membrane layer, with the result that the membrane layer is deflectable with respect to the first electrode layer and is spaced apart from said first electrode layer by a first distance value.

One concept of the present disclosure consists in configuring at least one membrane of a microelectromechanical membrane arrangement based on a capacitive principle of action to have depressions or a predetermined corrugated nature, with the result that capacitive vertical regions of the membrane arrangement are produced, whose membrane sections are shifted laterally with respect to one another during a vertical movement of the membranes. As a result, a vertical membrane movement causes a change in capacitance of the vertical regions which has a linear profile with the membrane deflection.

A considerable advantage of this membrane arrangement consists in that, even in the case of small vertical membrane deflections, a large change in capacitance is caused or, in the case of slight changes in capacitance owing to small changes in voltage between the membranes, high membrane deflections result. Overall, there is a considerably larger signal excursion in the case of small changes in measured value, i.e. greater sensitivity of the membrane arrangement results for such membrane arrangements.

Such membrane arrangements with high sensitivity can be configured so as to have correspondingly smaller dimensions since the effective active capacitive area is increased. This advantageously results in a lower installation space requirement and a less expensive design.

When using such membrane arrangements in actuators, relatively high acceleration values for the membranes at a relatively low voltage can be achieved. In the case of sensors, relatively large signal excursions can be achieved for the same reasons.

A further positive effect of the membrane arrangements according to the disclosure consists in the improved mechanical stability and rigidity which can be set by the selection of the geometry of the depressions or the corrugated nature.

In accordance with one embodiment of the membrane arrangement according to the disclosure, the membrane layer can have a multiplicity of second depressions formed over the first depressions. As a result, a region of overlap between the electrode layer and the membrane layer which changes linearly with a vertical movement of the membrane layer can be provided.

In accordance with a further embodiment of the membrane arrangement according to the disclosure, the second depressions can be configured so as to engage in the first depressions one inside the other without any touching contact when the membrane layer is deflected perpendicular to the surface of the substrate. As a result, advantageously a lateral sensor or actuator capacitance with a high acceleration even from the zero position can be provided.

In accordance with a further embodiment of the membrane arrangement according to the disclosure, the second depressions can have outer walls having a vertical extent which is greater than the first distance value. Alternatively, the second depressions can have outer walls with a vertical extent which is precisely the same size as the first distance value. In this way, either a particularly compact and flat membrane geometry can be configured or a membrane geometry without parasitic capacitances in the zero position of the deflectable membrane layer.

In accordance with a further embodiment of the membrane arrangement according to the disclosure, the outer walls of the first depressions can have a second distance value from the outer walls of the second depressions parallel to the surface of the substrate. By virtue of setting the second distance value, the sensitivity of the membrane arrangement can advantageously be adjusted.

In accordance with a further embodiment of the membrane arrangement according to the disclosure, the membrane arrangement can furthermore comprise a second electrically conductive electrode layer, which is arranged over the membrane layer, and is spaced apart from said membrane layer by the first distance value and which has a multiplicity of third depressions formed over the first depressions. A relatively large signal excursion or a relatively large acceleration of the membrane layer can be achieved by virtue of this double-membrane structure.

In accordance with a further embodiment of the membrane arrangement according to the disclosure, the outer walls of the second depressions can have the second distance value from the outer walls of the third depressions parallel to the surface of the substrate. As a result, a symmetrical double-membrane structure is provided which achieves high signal excursions and high acceleration values of the membrane layer.

In accordance with a further embodiment of the membrane arrangement according to the disclosure, the first electrode layer and the substrate can have a multiplicity of first pressure compensation holes, which are formed in the first depressions. These pressure compensation holes are used for allowing the air located in the interspaces between the electrode layer and the membrane layer to escape during a movement of the membrane layer, with the result that the flow resistance through the pressure compensation holes is advantageously lower than along the interspaces.

In accordance with a further embodiment, the first electrode layer is formed directly by the substrate.

In accordance with a further embodiment of the membrane arrangement according to the disclosure, the membrane layer can have a multiplicity of second pressure compensation holes, which are formed in the membrane layer between the second depressions. These pressure compensation holes are used to allow the air located in the interspaces between the electrode layer and the membrane layer to escape during a movement of the membrane layer, with the result that the flow resistance through the pressure compensation holes is advantageously lower than along the interspaces.

In accordance with a further embodiment of the membrane arrangement according to the disclosure, the second electrode layer can have a multiplicity of third pressure compensation holes, which are formed in the third depressions and/or between the third depressions. These pressure compensation holes are used to allow the air located in the interspaces between the second electrode layer and the membrane layer to escape during a movement of the membrane layer, with the result that the flow resistance through the pressure compensation holes is advantageously lower than along the interspaces.

In accordance with one embodiment of the method according to the disclosure, furthermore, at least one second through-hole can be formed in the electrically conductively membrane layer. This through-hole can then act as pressure compensation hole.

Further features and advantages of embodiments of the disclosure result from the description below with reference to the attached drawings.

BRIEF DESCRIPTION OF THE DRAWINGS

The described configurations and developments can, where expedient, be combined with one another as desired. Further possible configurations, developments and implementations of the disclosure also include combinations of features of the disclosure, which have been described previously or below with respect to the exemplary embodiments, which have not been explicitly mentioned.

The attached drawings are intended to provide improved understanding of the embodiments of the disclosure. They illustrate embodiments and, in conjunction with the description serve to explain principles and concepts of the disclosure. Other embodiments and many of the mentioned advantages can be gleaned from the drawings. The elements in the drawings are not necessarily shown true to scale with respect to one another. Directional indications such as "left", "right", "top", "bottom", "above", "below", "next to" or the like are merely used for explanatory purposes in the description below without any loss of generality.

In the drawings:

FIG. 1 shows a schematic illustration of a microelectromechanical membrane arrangement in a cross-sectional view in accordance with one embodiment of the present disclosure;

FIG. 2 shows a schematic illustration of a microelectromechanical membrane arrangement in a cross-sectional view in accordance with a further embodiment of the present disclosure;

FIG. 3 shows a schematic illustration of a microelectromechanical membrane arrangement in a cross-sectional view in accordance with a further embodiment of the present disclosure;

FIG. 4 shows a schematic illustration of a microelectromechanical membrane arrangement in a cross-sectional view in accordance with a further embodiment of the present disclosure;

FIG. 5 shows a schematic illustration of a microelectromechanical membrane arrangement in a cross-sectional view in accordance with a further embodiment of the present disclosure;

FIG. 6 shows a schematic illustration of a microelectromechanical membrane arrangement in a plan view in accordance with a further embodiment of the present disclosure;

FIG. 7 shows a schematic illustration of a microelectromechanical membrane arrangement in a plan view in accordance with a further embodiment of the present disclosure;

FIG. 8 shows a schematic illustration of a microelectromechanical membrane arrangement in a plan view in accordance with a further embodiment of the present disclosure;

FIGS. 9 to 13 show schematic illustrations of process steps in a method for producing a microelectromechanical membrane arrangement in accordance with a further embodiment of the present disclosure; and FIGS. 14 to 18 show schematic illustrations of the process steps in a method for producing a microelectromechanical membrane arrangement in accordance with a further embodiment of the present invention disclosure.

The microelectromechanical membrane arrangements (MEMS membrane arrangements) shown can each be used for microelectromechanical components (MEMS components) such as, for example, signal transducers or measuring transducers, MEMS sensors, MEMS actuators or membrane-based inertial sensors. Such MEMS components can include, for example, pressure sensors, microphones, loudspeakers or other acoustic energy transducers.

DETAILED DESCRIPTION

Depressions within the meaning of the present disclosure are all deviations in shape of the component which are perpendicular or substantially perpendicular to a surface of a substantially planar component. In particular, depressions within the meaning of the present disclosure can be grooves, corrugations, beads, flutes, channels, troughs or similar angular or wavy convexities of the substantially planar component. In this case, the depressions can be arranged along the surface of the substantially planar component at regular or irregular distances from one another. The depressions can have a multiplicity of depression sections running perpendicular to the lateral extent of the substantially planar component.

Two substantially planar components which are arranged planar-parallel one above the other and spaced apart from one another in the direction of their lateral extent, can in this case have depressions which substantially coincide with one another in such a way that the individual depressions engage in one another in the case of a movement of the substantially planar components towards one another without the two components touching one another. In other words, the depressions in one component have a similar physical configuration to those of the other component, wherein the depressions of one component have smaller physical dimensions than the depressions of the other component. In this way, meshing of the components one inside the other can be achieved, with the result that a relative movement of the two substantially planar-parallel components perpendicular to their lateral extents is possible without the components touching one another.

Similarly, three substantially planar components can be arranged planar-parallel with respect to one another, with the result that it is possible for the components located in the center and in each case one of the components arranged on the outside to engage one inside the other without any touching contact in the event of an up-and-down movement relative to the outer components.

Figure 1:
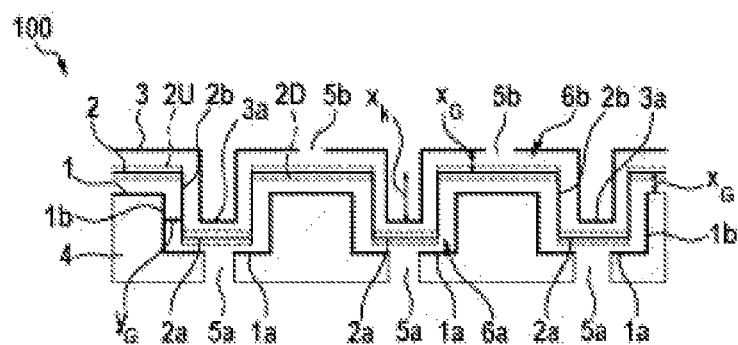

FIG. 1 shows a schematic illustration of a microelectromechanical membrane arrangement 100 in a cross-sectional view. The membrane arrangement 100 comprises a substrate 4 having cutouts, a first electrically conductive electrode layer 1, which is applied to a surface of the substrate 4. The first electrode layer 1 can be, for example, a monocrystalline silicon layer. Alternatively, it may also be possible to configure the first electrode layer 1 to have a metallization layer. In another variant embodiment, the first electrode layer 1 can be a first functional layer on a silicon-on-insulator wafer 4 (SOI wafer). The first electrode layer 1 can have first depressions 1a, which are designed to substantially coincide with the cutouts in the substrate 4. In the example in FIG. 1, the cutouts are in the form of right-parallelepipedal grooves with outer walls which are substantially perpendicular to the surface of the substrate 4 and which extend over a predetermined, for example constant depth into the substrate 4.

An electrically conductive membrane layer 2 which is deflectable in a direction perpendicular to the surface of the substrate 4 can be arranged over the first electrode layer 1. In a variant embodiment, the membrane layer 2 can consist of polysilicon, for example. The membrane layer 2 can be suspended on the substrate via one or more suspension webs at suspension points outside the section area illustrated in FIG. 1, with the result that the membrane layer 2 is mounted in pendulous fashion over the first electrode layer 1. The membrane layer 2 is spaced apart from the first electrode layer 1 by a first (vertical) distance value $x_G$. The distance value $x_G$ can be, for example, between $0.1\mu$ and $10\mu$.

In this case, the membrane layer 2 has second depressions 2a, which are arranged substantially over the first depressions 1a in such a way that the outer dimensions of the second depressions 2a are slightly smaller than the corresponding dimensions of the first depressions 1a. As a result, the second depressions 2a can engage in the first depressions 1a without any touching contact. The outer walls 2b of the second depressions 2a are spaced apart from the outer walls 1b of the first depressions 1a by a distance value $y_G$.

By virtue of the vertical movement of the membrane layer 2, for example in the event of actuation of the membrane layer 2, the membrane layer 2 can be moved up and down substantially perpendicular to the surface of the substrate 4, as indicated in FIG. 1 by means of the dashed lines. For example, the maximum deflection upwards can result in a position 2U of the membrane layer 2, while the maximum deflection downwards can result in a position 2D of the membrane layer 2.

The membrane arrangement 100 furthermore has a second electrically conductive electrode layer 3, which is arranged over the membrane layer 2 and is spaced apart from said membrane layer by the first distance value $x_G$. The second electrically conductive electrode layer 3 can be produced from polysilicon or a metallization layer, for example. The second electrode layer 3 can have a multiplicity of third depressions 3a formed over the first depressions 1a. For the third depressions 3a, substantially the same can apply in respect of the relationship with respect to the second depressions 2a as for the relationship of the second depressions 2a with respect to the first depressions 1a. In other words, the membrane arrangement 100 is structured in such a way that the geometric structures of the depressions 1a, 2a and 3a coincide with one another in such a way that a movement of the membrane layer 2 in the interspace between the electrode layers 1 and 3 is enabled in such a way that the second depressions 2a mesh with the first and third depressions 1a and 3a, respectively, without any touching contact.

The first electrode layer 1 and the substrate 4 can have first through-holes or pressure compensation holes 5a, which are formed in the base of the first depressions 1a. An exchange of air or another medium filling the first interspaces 6a between the first electrode layer 1 and the membrane layer 2 is enabled via the first pressure compensation holes 5a. Preferably, the dimensions of the first pressure compensation holes 5a are configured such that the flow resistance of the air or of the other medium through the first pressure compensation holes 5a is less than along the first interspace 6a. As a result, the air or the other medium preferably escapes through the first pressure compensation holes 5a.

The second electrode layer 3 can have second through-holes or pressure compensation holes 5b, which are formed between the third depressions 3a. An exchange of air or another medium filling the second interspaces 6a between the second electrode layer 3 and the membrane layer 2 is enabled via the second pressure compensation holes 5b. Preferably, the dimensions of the second pressure compensation holes 5b are configured in such a way that the flow resistance of the air or of the other medium through the second pressure compensation holes 5b is less than along the second interspace 6b. As a result, the air or the other medium preferably escapes through the second pressure compensation holes 5b.

The number of first and second pressure compensation holes 5a and 5b, respectively, is in this case not limited, in principle. In particular, provision can be made of pressure compensation holes 5a and 5b, respectively, not to be formed in each first depression 1a or between each pair of third depressions 3a.

The outer walls 2b of the second depressions 2a can have the same second distance value $y_G$ from the outer walls of the third depressions 3a parallel to the surface of the substrate 4 as the outer walls 2b of the second depressions 2a from the outer walls 1b of the first depressions 1a.

Figure 2:
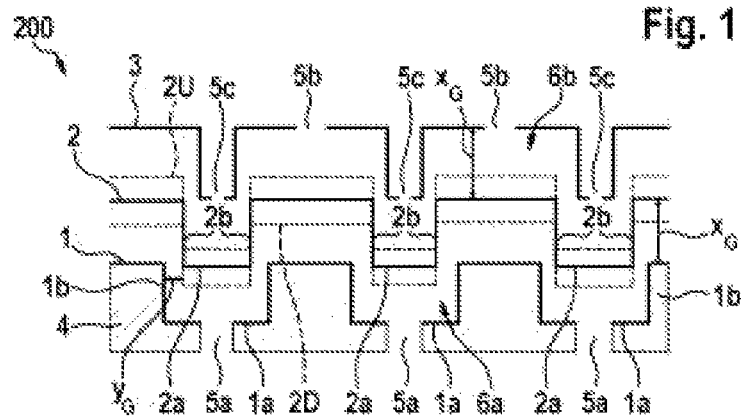

FIG. 2 shows a schematic illustration of a further microelectromechanical membrane arrangement 200 in a cross-sectional view. The microelectromechanical membrane arrangement 200 differs from the microelectromechanical membrane arrangement 100 substantially only in that the vertical distance $x_G$ between the membrane layer 2 and the first and second electrode layers 1 and 3, respectively, is selected to be precisely the same size as the vertical extent $x_k$ of the depressions 2a and 1a and 3a, respectively. In addition, through-holes or pressure compensation holes 5c can also be formed in the base of third depressions 3a in the microelectromechanical membrane arrangement 200. The parasitic capacitance components can advantageously be reduced with the membrane arrangement 200 in comparison with the membrane arrangement 100 at the expense of the amount of installation space required.

Figure 3:
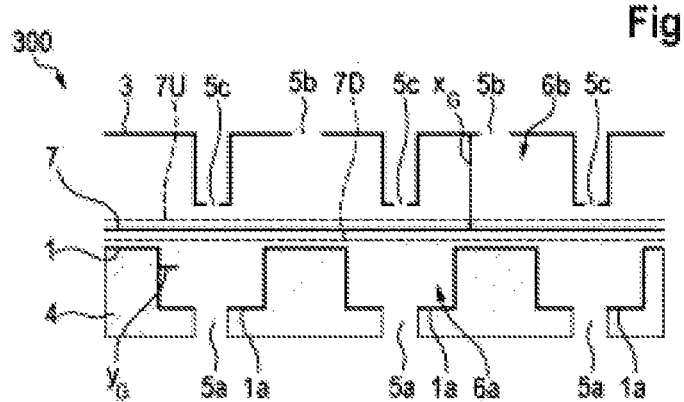

FIG. 3 shows a schematic illustration of a further microelectromechanical membrane arrangement 300 in a cross-sectional view. The microelectromechanical membrane arrangement 300 differs from the microelectromechanical membrane arrangement 200 substantially only in that a membrane layer 7, which is formed planar-parallel to the surface of the substrate 4, is used between the first and second electrode layers 1 and 3 instead of a membrane layer 2 with depressions 2, which membrane layer 7 is movable between a maximum deflection 7U upwards and a maximum deflection 7U downwards with respect to the electrode layers 1 and 3.

Figure 4:
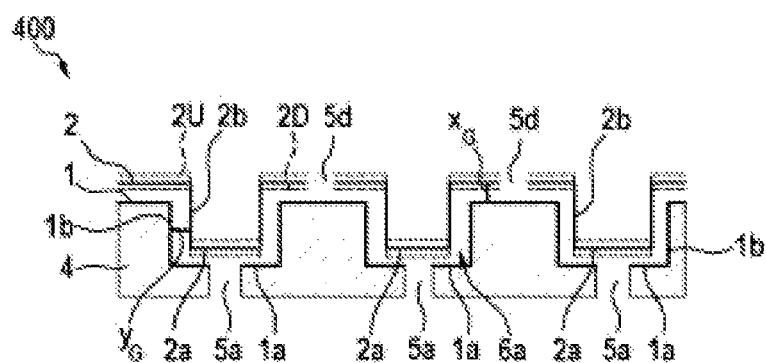

FIG. 4 shows a schematic illustration of a further microelectromechanical membrane arrangement 400 in a cross-sectional view. The microelectromechanical membrane arrangement 400 differs from the microelectromechanical membrane arrangement 100 substantially only in that there is no second electrode layer 3. Instead, the membrane layer 2 has through-holes or pressure compensation holes 5d between the depressions 2a in the membrane layer 2.

Figure 5:
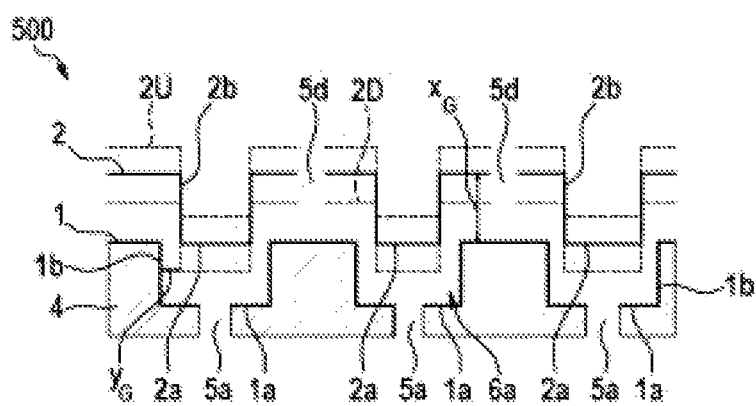

FIG. 5 shows a schematic illustration of a further microelectromechanical membrane arrangement 500 in a cross-sectional view. The microelectromechanical membrane arrangement 500 differs from the microelectromechanical membrane arrangement 400 substantially only in that the vertical distance $x_G$ between the membrane layer 2 and the first electrode layer 1 is selected to be precisely the same size as the vertical extent $x_k$ of the depressions 2a and 1a. In this way, as mentioned above, a reduction in the parasitic capacitance components can be provided at the expense of the amount of installation space required.

Figure 6:
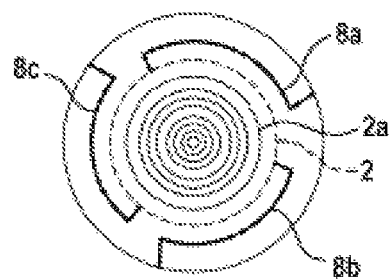
Figure 7:
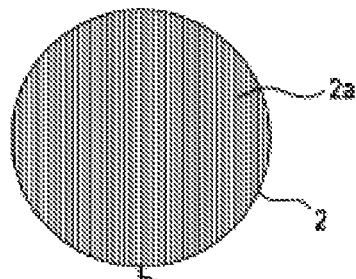
Figure 8:
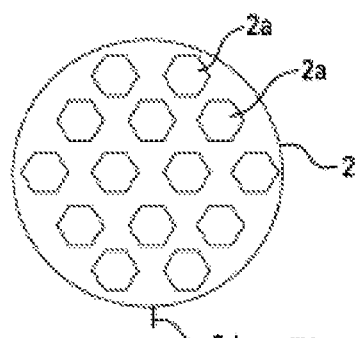

FIGS. 6, 7 and 8 show schematic illustrations of microelectromechanical membrane arrangements in plan views. The membrane arrangements illustrated in FIGS. 6, 7 and 8 can correspond to the membrane arrangements 100, 200, 300, 400, 500 in FIGS. 1 to 5. In FIG. 6, the membrane layer 2 is circular, and the depressions 2a are in the form of circular and concentrically arranged channels or beads. The membrane layer 2 can be suspended on a substrate via suspension webs 8a, 8b, 8c. By way of example, the number of suspension webs is three in FIG. 6, but any other number of suspension webs is likewise possible.

In FIG. 7, the membrane layer 2 is formed with longitudinal channels or longitudinal beads in the form of depressions 2a. The suspension of the membrane layer 2 in this case takes place via a suspension web 8d. In FIG. 8, the membrane layer 2 is formed with polygonal troughs as depressions 2a, with the result that, for example, an eggbox-like surface structure of the membrane layer 2 is produced. It is of course also possible for other polygonal or rounded structures to be selected for the troughs in FIG. 8. By way of example, the number of suspension webs 8d in FIGS. 7 and 8 is one, but any other number of suspension webs 8d is likewise possible.

With the present membrane arrangements 100, 200, 300, 400, 500, as illustrated in FIGS. 1 to 8, in the case of actuated membranes, for example in the case of a loudspeaker, in the case of a linear out-of-plane drive or in the case of an ultrasonic transducer, a high degree of acceleration of the membrane even from a rest position is possible. This advantageously results in high acoustic pressures and therefore in efficient operation of an MEMS actuator using the membrane arrangement.

In principle, it is true that the acoustic pressure p is proportional to the acceleration a of the membrane. The acceleration a of the membrane results from its motion equation. If an electrostatic force is used between a planar membrane layer and an electrode layer arranged planar-parallel thereto for acceleration purposes and if it is further assumed that the membrane layer is approximately freely movable, the following results for the acceleration a:

$$a = \frac{d^2 x}{dt^2} = \frac{\varepsilon_0 \cdot \varepsilon_r \cdot A \cdot U^2}{2 \cdot m \cdot (x \cdot x_G)^2},$$

where $\varepsilon_0$ is the dielectric constant in a vacuum, $\varepsilon_r$ is the dielectric constant of the medium between the membrane and the electrode layer, x is the instantaneous deflection of the membrane, $x_G$ is the distance between the membrane and the electrode layer, t is time, U is the voltage present between the membrane and the electrode layer, m is the mass of the membrane, and A is the planar-parallel area of the membrane and the electrode layer.

In the case of a membrane suspended in a resilient manner, in addition acceleration is necessary also counter to the spring force kx, where k is the spring constant, which is ever increasing with the deflection, such that the acceleration a is reduced by a magnitude of kx. The acceleration a is therefore particularly high whenever the retarding forces, for example the spring force kx or the damping of the membrane, are particularly high.

If the electrode layer or the membrane layer has additional depressions, i.e. sections in which the membrane layer is laterally shifted in the case of a vertical movement of the membrane with respect to the electrode layer, the following results for the electrostatic force F onto a membrane layer section moving vertically with respect to fixed electrode layer sections:

$$F = \frac{1}{2} \cdot \frac{dC_y}{dx} \cdot U^2 = \frac{\varepsilon_0 \cdot \varepsilon_r \cdot L_y}{2 \cdot y_G^2},$$

where $C_y$ is the value of the capacitance between vertical membrane layer sections and vertical electrode layer sections, $y_G$ is the distance between vertical membrane layer sections and vertical electrode layer sections, and $L_y$ is the length of all of the vertical membrane layer sections. The vertical membrane layer sections can in this case be the sections 2b in FIGS. 1, 2, 4 and 5. The vertical electrode layer sections can in this case be the sections 1b in FIGS. 1 to 5.

With this additional retarding force, a total motion equation for membrane arrangements with interleaved depressions, such as, for example, for the membrane arrangements 100, 200, 300, 400, 500 shown in FIGS. 1 to 5 results as follows:

$$a = \frac{d^2 x}{dt^2} = \frac{\varepsilon_0 \cdot \varepsilon_r \cdot U^2}{2 \cdot \rho \cdot d \cdot (A + x_k \cdot L_y)} \cdot \left( \frac{A}{(x - x_G)^2} + \frac{L_y}{y_G} \right),$$

where ρ is the density of the membrane layer material, d is the thickness of the membrane layer and $x_k$ is the depth or vertical extent of the depressions. Thus, an adjustable acceleration term can be provided via the vertical depression sections or the geometric dimensions thereof which permits high accelerations even from the rest position of the membrane.

With the present membrane arrangements 100, 200, 300, 400, 500, as illustrated in FIGS. 1 to 8, conversely a large signal excursion is possible in the case of sensing membranes, for example in the case of a microphone, or in the case of an acoustic pressure sensor, as a result of an acceleration of the membrane out of the rest position. As a result, an MEMS sensor using the membrane arrangement can be operated efficiently and with a high degree of measurement sensitivity.

The measured capacitance $C_x$ between a planar membrane and an electrode layer arranged planar-parallel with respect thereto is as follows:

$$C_x = \frac{\varepsilon_0 \cdot \varepsilon_r \cdot A}{(x - x_G)}.$$

A change in the vertical distance x between the membrane and the electrode layer results in a change in capacitance of $$\frac{dC_x}{dx} = \frac{\varepsilon_0 \cdot \varepsilon_r \cdot A}{(x - x_G)^2} \Rightarrow \frac{dC_x}{C_x} = \frac{dx}{(x - x_G)},$$

i.e. the change in capacitance is relatively low for small deflections. For a membrane layer or an electrode layer with depressions, as explained in connection with the membrane arrangements 100, 200, 300, 400, 500 in FIGS. 1 to 5, a measured capacitance $C_G$ of $$C_G = \frac{\varepsilon_0 \cdot \varepsilon_r \cdot A}{(x - x_G)} + \frac{\varepsilon_0 \cdot \varepsilon_r \cdot (x_k + x) \cdot L_y}{y_G}$$

results.

Accordingly, the change in capacitance of such a measured capacitance $C_G$ is:

$$\frac{dC_G}{dx} = \frac{\varepsilon_0 \cdot \varepsilon_r \cdot A}{(x - x_G)^2} + \frac{\varepsilon_0 \cdot \varepsilon_r \cdot L_y}{y_G} \Rightarrow \frac{dC_G}{C_G} = \frac{\left( \frac{A}{(x - x_G)} + \frac{L_y}{y_G} \right) \cdot dx}{\left( \frac{A}{(x - x_G)} + \frac{(x_k + x) \cdot L_y}{y_G} \right)}.$$

In comparison with planar-parallel membranes and electrode layers, there is therefore an improved signal excursion even in the case of small deflections or in the case of large vertical distance values. In particular, the signal excursion can be adjusted via the geometry of the depressions.

In order to avoid parasitic capacitances it is possible, as illustrated by way of example for the membrane arrangements 200 or 500 in FIGS. 2 and 5, for the vertical distance $x_G$ between the membrane layer 2 and the electrode layers 1 and 3 to be selected to be precisely the same size as the vertical extent $x_k$ of the depressions 2a and 1a and 3a, respectively. Therefore, in the rest position of the membrane layer 2, the vertical capacitance component is substantially zero. At the same time, however, a small deflection results in the production of an overlap or meshing between the depressions 2a and 1a and 3a, respectively, which brings about a non-vanishing vertical capacitance component.

FIGS. 9 to 13 show process steps in a method for producing a membrane arrangement. The method can be used, for example, to produce a membrane arrangement 100, 200, 300, 400, 500 as shown in FIGS. 1 to 8.

First, cutouts 4a are produced in a substrate 4, for example an SOI wafer. A first electrically conductive electrode layer 1 can be introduced into these cutouts 4a and over the surface of the substrate 4, wherein the electrode layer 1 has a multiplicity of first depressions 1a coinciding with the cutouts 4a. Furthermore, sacrificial webs 4b can be formed in the cutouts 4a, for example by generating trenches in the cutouts 4a. The sacrificial webs 4b can be used as oxidation points for forming an oxide layer 4c. The oxide layer in FIG. 11 completely fills the cutouts 4a and covers the surface of the substrate 4. If appropriate, a chemical-mechanical processing step (CMP) for planarizing and thinning the oxide layer 4c can be performed. Then, the oxide layer 4c can be etched selectively in the cutouts 4a, for example via a lithography step.

Then, an electrically conductive membrane layer 2 is deposited on the oxide layer 4c. The electrically conductive membrane layer 2 can be formed by deposition of polysilicon, for example. In this case, the membrane layer 2 can have depressions 2a coinciding with the cutouts 4a. First through-holes 5a can be formed in the substrate 4 and the first electrically conductive electrode layer 1, through which through-holes 5a the oxide layer 4c can be etched. As a result, the electrically conductive membrane layer 2 is freed, with the result that the membrane layer 2 is deflectable with respect to the first electrode layer 1 and is spaced apart from said first electrode layer by a first distance value $x_G$. Optionally, through-holes 5d can also be formed in the membrane layer 2.

FIGS. 14 to 18 show process steps in a further method for producing a membrane arrangement. The method can be used, for example, to produce a membrane arrangement 100, 200, 300, 400, 500 as shown in FIGS. 1 to 8.

Figure 9:
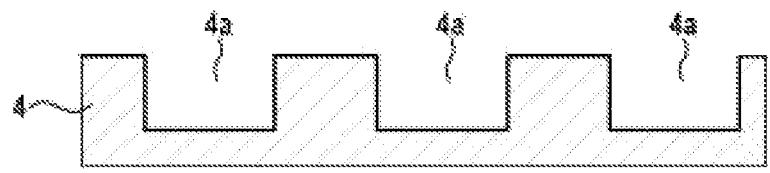
Figure 10:
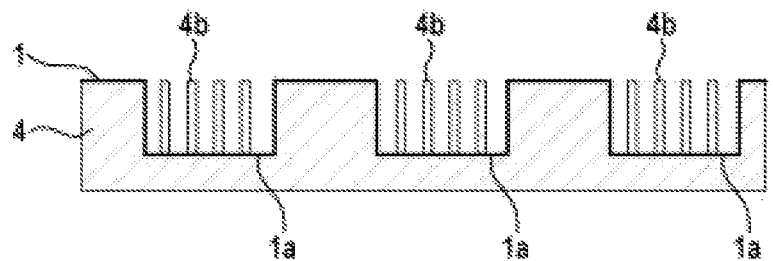
Figure 11:
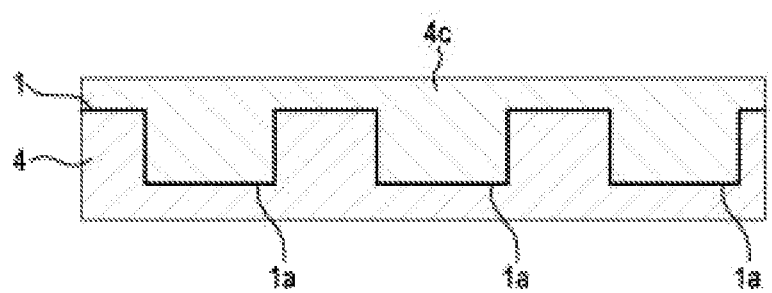
Figure 12:
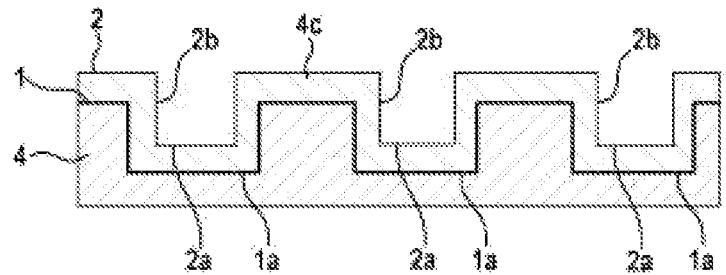
Figure 13:
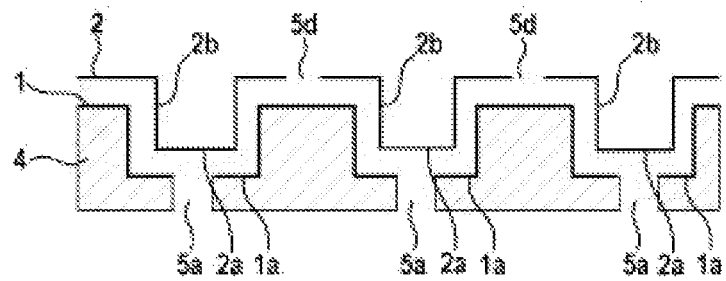
Figure 14:
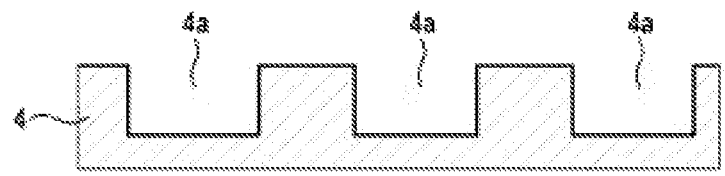
Figure 15:
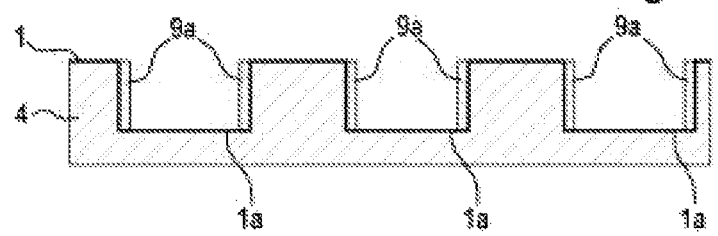
Figure 16:
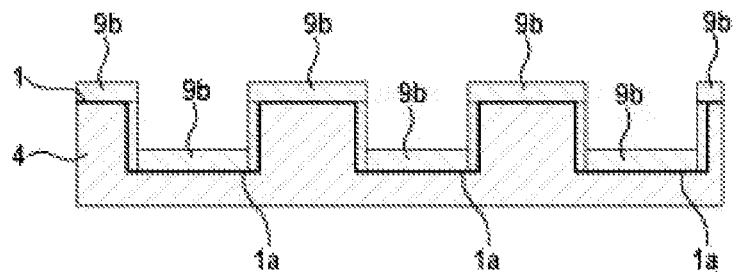
Figure 17:
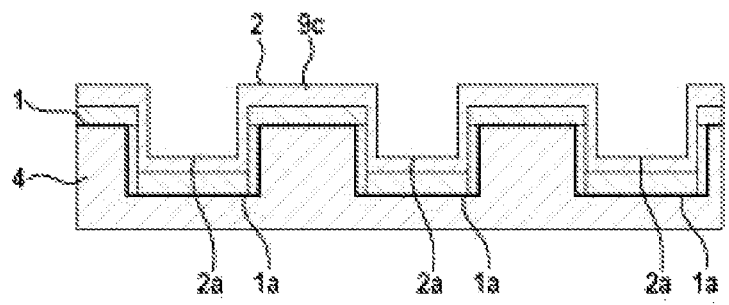
Figure 18:
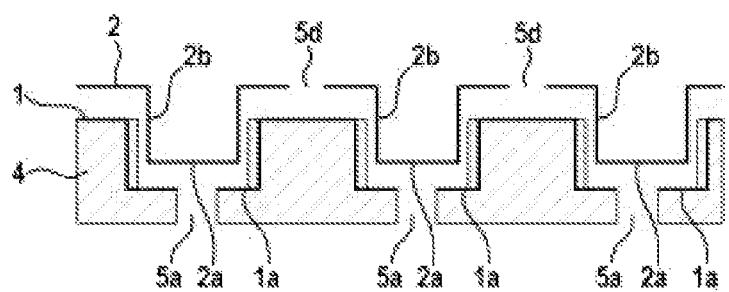

In a similar manner to that shown in FIG. 9, firstly cutouts 4a are formed in a substrate 4, over which an electrode layer 1 is formed. Nitride strips can be formed, for example, vertically on the outer walls of the cutouts 1a by means of a deposition process and subsequent targeted etching process. An oxide layer 9b, for example a LOCOS oxide, can be formed over the surface of the substrate 4 and the cutouts 4. In a further deposition process, for example, TEOS oxide layers 9c can be formed over the oxide layers 9b and the nitride layer 9a. Then, a membrane layer 2, for example consisting of polysilicon, can be deposited over the TEOS oxide layers 9c.

In turn, it is then possible for first through-holes 5a to be formed in the substrate 4 and the first electrically conductive electrode layer 1, through which holes the oxide layers 9b and 9c can be etched. As a result, the electrically conductive membrane layer 2 is freed, with the result that the membrane layer 2 is deflectable with respect to the first electrode layer 1 and is spaced apart from said first electrode layer by a first distance value $x_G$. Optionally, through-holes 5d can also be formed in the membrane layer 2.

In order to prevent distortions in the outer walls 2b and 1b of the depressions 2a and 1a, respectively, bending radii at the lines of abutment of the layer sections which are vertical with respect to one another can be rounded, for example, by means of isotropic etching steps or vacuum annealing measures, for example. Similar measures can also be performed to improve the emission impedance in the case of the through-holes 5a to 5d.

The invention claimed is:

1. A microelectromechanical membrane arrangement, comprising:
   a substrate having an upper surface in which a plurality of cutouts are defined;
   a first electrically conductive electrode layer arranged on the surface of the substrate and along walls of the cutouts, thereby defining a plurality of first depressions corresponding to the plurality of cutouts; and
   an electrically conductive membrane layer configured to be deflected in a direction perpendicular to the surface of the substrate, arranged over the first electrode layer, and spaced apart from the first electrode layer by a first distance.

2. The membrane arrangement as claimed in claim 1, wherein the membrane layer defines a plurality of downwardly extending second depressions formed over and aligned with corresponding first depressions of the plurality of first depressions.

3. The membrane arrangement as claimed in claim 2, wherein the second depressions are configured to extend within the corresponding first depressions of the plurality of first depressions, each of the second depressions and each of the corresponding first depressions being spaced apart from one another when the membrane layer is deflected perpendicular to the surface of the substrate.

4. The membrane arrangement as claimed in claim 2, wherein the second depressions have outer walls having a vertical extent which is greater than the first distance.

5. The membrane arrangement as claimed in claim 2, wherein the second depressions have outer walls with a vertical extent which is equal to the first distance.

6. The membrane arrangement as claimed in claim 2, wherein outer walls of the first depressions are spaced apart from outer walls of the second depressions by a second distance in a direction parallel to the surface of the substrate.

7. The membrane arrangement as claimed in claim 1, further comprising:
   a second electrically conductive electrode layer arranged over the membrane layer and defining a plurality of third depressions formed over the plurality of first depressions.

8. The membrane arrangement as claimed in claim 7, wherein outer walls of the second depressions are spaced apart from outer walls of the third depressions by a second distance in a direction parallel to the surface of the substrate.

9. The membrane arrangement as claimed in claim 1, wherein the first electrode layer and the substrate define a plurality of first pressure compensation holes formed in a floor portion of the first depressions.

10. The membrane arrangement as claimed in claim 1, wherein the first electrode layer is formed by the substrate.

11. The membrane arrangement as claimed in claim 2, wherein the membrane layer defines a plurality of second pressure compensation holes formed between the second depressions.

12. The membrane arrangement as claimed in claim 7, wherein the second electrode layer defines a plurality of third pressure compensation holes formed at least one of in the third depressions and between the third depressions.

13. A microelectromechanical component having a microelectromechanical membrane arrangement, comprising:
   a substrate having a surface in which a plurality of cutouts are defined;
   a first electrically conductive electrode layer arranged on the surface of the substrate and along walls of the cutouts, thereby defining a plurality of first depressions corresponding to the plurality of cutouts; and
   an electrically conductive membrane layer configured to be deflected in a direction perpendicular to the surface of the substrate, arranged over the first electrode layer, and spaced apart from the first electrode layer by a first distance.

14. The microelectromechanical component as claimed in claim 13, wherein the microelectromechanical component is one of a pressure sensor, a microphone and a loudspeaker.

15. A method for producing a membrane arrangement, comprising:
   introducing a plurality of cutouts into a surface of a semiconductor substrate;
   forming a first electrically conductive electrode layer on the surface of the substrate and along walls of the cutouts, the electrode layer defining a plurality of first depressions coinciding with the plurality of cutouts;
   forming an oxide layer on the first electrode layer;
   depositing an electrically conductive membrane layer on the oxide layer;
   forming first through-holes in the substrate and the first electrode layer; and
   etching the oxide layer through the first through-holes in order to free the membrane layer such that the membrane layer is configured to deflect with respect to the first electrode layer and spaced apart from the first electrode layer by a first distance.

16. A microelectromechanical membrane arrangement, comprising:
- a substrate having a surface in which a plurality of cutouts are defined;
- a first electrically conductive electrode layer arranged on the surface of the substrate and defining a plurality of first depressions corresponding to the plurality of cutouts; and
- an electrically conductive membrane layer configured to be deflected in a direction perpendicular to the surface of the substrate, arranged over the first electrode layer, and spaced apart from the first electrode layer by a first distance,
- wherein the membrane layer defines a plurality of second depressions formed over the plurality of first depressions, and
- wherein the second depressions are configured to engage in corresponding first depressions of the plurality of first depressions, each of the second depressions and each of the corresponding first depressions being spaced apart from one another when the membrane layer is deflected perpendicular to the surface of the substrate.

17. The membrane arrangement as claimed in claim 16, wherein the second depressions have outer walls having a vertical extent which is greater than the first distance.

18. The membrane arrangement as claimed in claim 16, wherein the second depressions have outer walls with a vertical extent which is equal to the first distance.

19. A microelectromechanical membrane arrangement, comprising:
- a substrate having a surface in which a plurality of cutouts are defined;
- a first electrically conductive electrode layer arranged on the surface of the substrate and defining a plurality of first depressions corresponding to the plurality of cutouts;
- an electrically conductive membrane layer configured to be deflected in a direction perpendicular to the surface of the substrate, arranged over the first electrode layer, and spaced apart from the first electrode layer by a first distance; and
- a second electrically conductive electrode layer arranged over the membrane layer and defining a plurality of third depressions formed over the plurality of first depressions.

20. A microelectromechanical membrane arrangement, comprising:
- a substrate having a surface in which a plurality of cutouts are defined;
- a first electrically conductive electrode layer arranged on the surface of the substrate and defining a plurality of first depressions corresponding to the plurality of cutouts;
- an electrically conductive membrane layer configured to be deflected in a direction perpendicular to the surface of the substrate, arranged over the first electrode layer, and spaced apart from the first electrode layer by a first distance,
- wherein the membrane layer defines a plurality of second depressions formed over the plurality of first depressions, and
- wherein the membrane layer defines a plurality of second pressure compensation holes formed between the second depressions.

* * * * *